United States Patent
Lai et al.

(10) Patent No.: US 9,478,628 B1
(45) Date of Patent: Oct. 25, 2016

(54) METAL GATE FORMING PROCESS

(71) Applicant: UNITED MICROELECTRONICS CORP., Hsin-Chu (TW)

(72) Inventors: Kuo-Chih Lai, Tainan (TW); Nien-Ting HO, Tainan (TW); Chi-Mao Hsu, Tainan (TW); Ching-Yun Chang, Yunlin County (TW); Yen-Chen Chen, Tainan (TW); Yang-Ju Lu, Changhua County (TW); Shih-Min Chou, Tainan (TW); Yun-Tzu Chang, Kaohsiung (TW); Hsiang-Chieh Yen, Penghu County (TW); Min-Chuan Tsai, New Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/853,956

(22) Filed: Sep. 14, 2015

(51) Int. Cl.
*H01L 21/4763* (2006.01)
*H01L 29/49* (2006.01)
*H01L 29/40* (2006.01)
*H01L 29/423* (2006.01)
*H01L 21/28* (2006.01)

(52) U.S. Cl.
CPC ..... *H01L 29/4966* (2013.01); *H01L 21/28088* (2013.01); *H01L 29/401* (2013.01); *H01L 29/42376* (2013.01)

(58) Field of Classification Search
CPC ............. H01L 29/4966; H01L 29/401; H01L 29/42376; H01L 21/28088
USPC ................. 438/642, 648, 656, 685
See application file for complete search history.

(56) References Cited

U.S. PATENT DOCUMENTS

| | | | |
|---|---|---|---|
| 7,713,874 B2 | 5/2010 | Milligan | |
| 8,836,049 B2 | 9/2014 | Tsai | |
| 9,230,835 B2 * | 1/2016 | Gelatos | H01L 21/28079 |
| 2010/0052079 A1 | 3/2010 | Hirano | |
| 2011/0140207 A1 | 6/2011 | Lin | |
| 2012/0225558 A1 * | 9/2012 | Chang | H01L 21/02063 |
| | | | 438/694 |
| 2015/0061041 A1 | 3/2015 | Lin | |
| 2015/0228491 A1 * | 8/2015 | Kang | H01L 21/28194 |
| | | | 257/330 |

* cited by examiner

*Primary Examiner* — Kevin M Picardat
(74) *Attorney, Agent, or Firm* — Winston Hsu; Scott Margo

(57) ABSTRACT

A metal gate forming process includes the following steps. A first metal layer is formed on a substrate by at least a first step followed by a second step, wherein the processing power of the second step is higher than the processing power of the first step.

16 Claims, 3 Drawing Sheets

US 9,478,628 B1

METAL GATE FORMING PROCESS

BACKGROUND OF THE INVENTION

1. Field of the Invention

The present invention relates generally to a metal gate forming process, and more specifically to a metal gate forming process including at least a metal layer formed by two processing steps.

2. Description of the Prior Art

Poly-silicon is conventionally used as a gate electrode in semiconductor devices, such as the metal-oxide-semiconductor (MOS). However, with the trend towards scaling down the size of semiconductor devices, the conventional poly-silicon gates face problems such as lower performance due to boron penetration and unavoidable depletion effect, which increases the equivalent thickness of the gate dielectric layer, reduces the gate capacitance, and worsens the driving force of the devices. Therefore, work function metals that are suitable to serve as high-K gate dielectric layers are used to replace the conventional poly-silicon gate to be the control electrode.

Therefore, barrier layers and wetting layers are deposited between layers such as work function metal layers to prevent these layers from diffusing to each other and to improve adhesion of these layers.

SUMMARY OF THE INVENTION

The present invention provides a metal gate forming process, which forms a metal layer by two sequential processing steps with a lower processing power followed by a higher processing power, thereby reducing layers below the metal layer from damage, improving gap filling, and hence leading better threshold voltage uniformity of adjacent formed devices.

The present invention provides a metal gate forming process including the following steps. A first metal layer is formed on a substrate by at least a first step followed by a second step, wherein the processing power of the second step is higher than the processing power of the first step.

According to the above, the present invention provides a metal gate forming process, which forms a first metal layer on a substrate. The first metal layer is formed by processing at least two steps. Such that, a first step is followed by a second step, wherein the processing power of the second step is higher than the processing power of the first step. By doing this, the first step with a relative lower processing power is carried out previously to prevent layers below the first metal layer from damage and to prevent ingredients of the below layers from splashing and polluting the formed first metal layer. Moreover, the second step with a relative higher processing power is carried out to get better gap filling and save processing time. As a result, better threshold voltage uniformity of adjacent formed devices can be achieved.

These and other objectives of the present invention will no doubt become obvious to those of ordinary skill in the art after reading the following detailed description of the preferred embodiment that is illustrated in the various figures and drawings.

DETAILED DESCRIPTION

In the following embodiment, a multi-gate MOSFET is presented, but the present invention is not restricted thereto. The present invention can be applied in planar or non-planar transistors.

Figure 1:
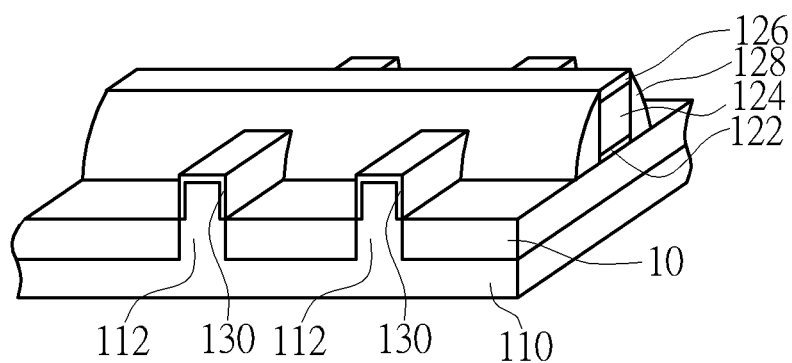
FIGS. 1-2 schematically depict three dimensional diagrams of a metal gate forming process according to one embodiment of the present invention.
Figure 2:
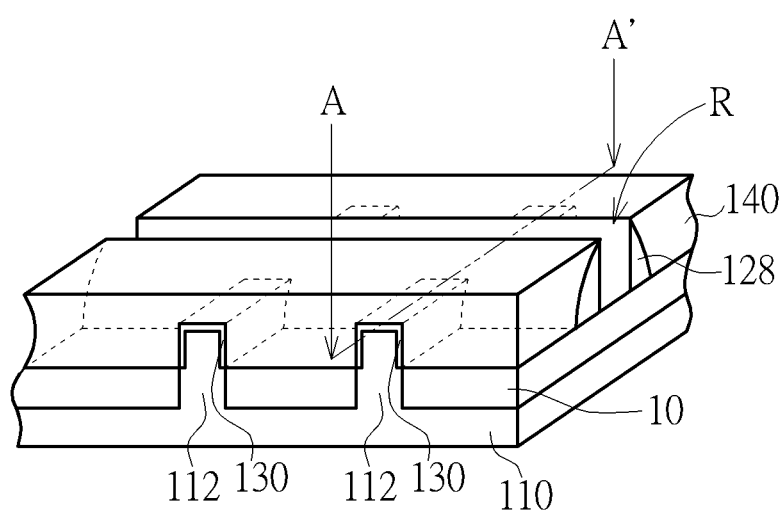

FIGS. 1-2 schematically depict three dimensional diagrams of a metal gate forming process according to one embodiment of the present invention. As shown in FIG. 1, two fin-shaped structures 122 are formed on a substrate 110. More precisely, the method of forming the fin-shaped structures 122 includes the following steps. A bulk substrate (not shown) is provided. A hard mask (not shown) is formed thereon. The hard mask (not shown) is patterned to define the locations of the fin-shaped structures 122. An etching process is performed on the bulk substrate (not shown) so that the fin-shaped structures 122 are formed. The fabrication of fin-shaped structures 122 is then finished.

In this embodiment, the hard mask (not shown) is removed after the fin-shaped structures 122 are formed, and a tri-gate MOSFET can be formed in the following processes. There are three contact faces between each of the fin-shaped structures 122 and the following formed dielectric layer functioning as a carrier channel whose width is wider than a channel width in a conventional planar MOSFET. When a driving voltage is applied, the tri-gate MOSFET produces a double on-current comparing to the conventional planar MOSFET. In another embodiment, the hard mask (not shown) is reserved to form a fin field effect transistor (Fin FET), which is another kind of multi-gate MOSFET. Due to the hard mask (not shown) being reserved in the fin field effect transistor, there are only two contact faces between each of the fin-shaped structures 122 and the following formed dielectric layer.

The present invention can also be applied to other semiconductor substrates. For example, a silicon-on-insulator substrate (not shown) is provided, and then a single crystalline silicon layer being a top part of the silicon-on-insulator substrate (not shown) is etched till an oxide layer being a middle part of the silicon-on-insulator substrate (not shown) is exposed, meaning the fin-shaped structure formed on the silicon-on-insulator substrate (not shown) is finished.

Two fin-shaped structures 112 are depicted in this embodiment, but the present invention can also be applied to one or more than two fin-shaped structures 112.

Isolation structures 10 are formed on the substrate 110 between the fin-shaped structures 112. The isolation structures 10 may be shallow trench isolation structures, but it is not limited thereto.

After the fin-shaped structures 112 are formed, a dielectric layer (not shown), an electrode layer (not shown) and a cap layer (not shown) are formed across the fin-shaped structures 112 and then three of them are patterned to form a dielectric layer 122, an electrode layer 124 and a cap layer 126. A spacer 128 is formed beside the dielectric layer 122, the electrode layer 124 and the cap layer 126. The dielectric layer 122 may be an oxide layer; the electrode layer 124 may be a polysilicon layer; the cap layer 126 may be a nitride layer, but they are not limited thereto. A source/drain region 130 may be respectively formed on each of the fin-shaped structures 112 beside the spacer 128 by methods such as an inclination ion implantation process.

As shown in FIG. 2, an interdielectric layer (not shown) is formed and covers the substrate 110, the fin-shaped structures 112, the spacer 128 and the cap layer 126. Then, the interdielectric layer (not shown) is planarized to form an interdielectric layer 140. The planarization process may include a chemical mechanical polishing (CMP) process or an etching process, but not limited to. As the planarization process is performed, the cap layer 126 is also removed to expose the electrode layer 124. Then, the electrode layer 124 is removed and a recess R is thereby formed. In following processes, metal materials will be filled into the recess R on the fin-shaped structures 112 to form metal gates.

For clarifying the structures of the present invention, FIGS. 3-8 schematically depict cross-sectional views of a metal gate forming process along an AA' section line of FIG. 2.

Figure 3:
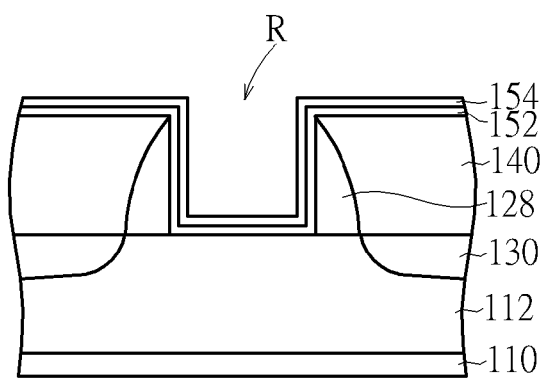
FIGS. 3-8 schematically depict cross-sectional views of a metal gate forming process alone AA' sectional line of FIG. 2.

As shown in FIG. 3, an optional buffer layer 152 and a dielectric layer 154 sequentially cover the recess R and the interdielectric layer 140. The optional buffer layer 152 maybe an oxide layer, which may be formed by a thermal oxide process, a chemical oxide process, or others. In this case, due to the optional buffer layer 152 being formed by a chemical oxide process, the optional buffer layer 152 can have a U-shaped cross-sectional profile. Instead, as the optional buffer layer 152 is formed by a thermal oxide process, the optional buffer layer 152 can have a " — "-shaped cross-sectional profile. The optional buffer layer 152 is located between the dielectric layer 154 and the substrate 110 to buffer the dielectric layer 154 and the substrate 110. A gate-last for high-k last process is applied in this embodiment, so that the dielectric layer 154 is a gate dielectric layer having a high dielectric constant, which may be the group selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalite ($SrBi_2Ta_2O_9$, SBT), lead zirconate titanate ($PbZr_xTi_1-xO_3$, PZT) and barium strontium titanate ($Ba_xSr_1-xTiO_3$, BST), but it is not limited thereto. In another embodiment, a gate-last for high-k first process may be applied instead.

Figure 4:
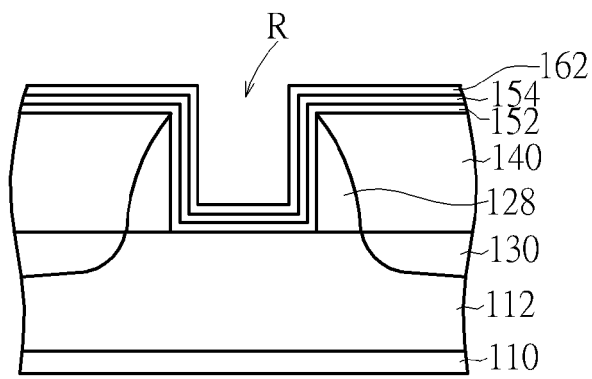

As shown in FIG. 4, a bottom barrier layer 162 covers the dielectric layer 154 and the interdielectric layer 140. The bottom barrier layer 162 is located on the dielectric layer 154 to prevent above disposed metals from diffusing downwards to the dielectric layer 154 and from polluting the dielectric layer 154. The bottom barrier layer 162 may be a single layer structure or a multilayer structure composed of tantalum nitride (TaN) or titanium nitride (TiN) etc., which may be formed by a physical vapor deposition process, but it is not limited thereto.

Figure 5:
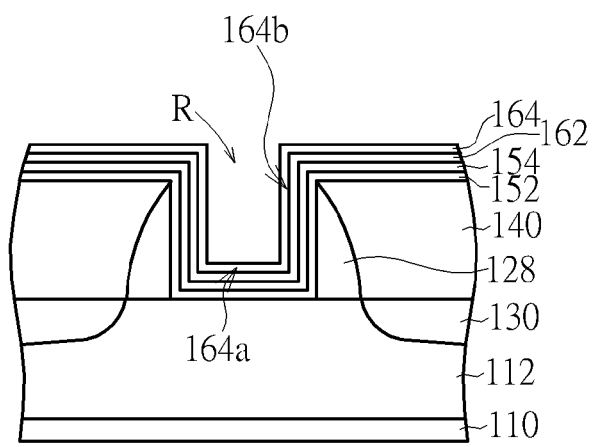

As shown in FIG. 5, a work function metal layer 164 then covers the bottom barrier layer 162. The work function metal layer 164 may be a single layer or a multilayer structure, composed of titanium nitride (TiN), titanium carbide (TiC), tantalum nitride (TaN), tantalum carbide (TaC), tungsten carbide (WC), titanium aluminide (TiAl) or aluminum titanium nitride (TiAlN) or others. For example, the work function metal layer 164 may be a titanium nitride layer suited for forming a PMOS transistor (the work function value is between the range of 4.8 eV and 5.2 eV). The work function metal layer 164 may be an aluminum titanium layer suited for forming a NMOS transistor (the work function value is between the range of 3.9 eV and 4.3 eV). In this embodiment, the work function metal layer 164 is formed by a physical vapor deposition (PVD) process, so that a bottom part 164a of the work function metal layer 164 has a thickness larger than that of sidewall parts 164b of the work function metal layer 164, but it is not limited thereto.

Figure 6:
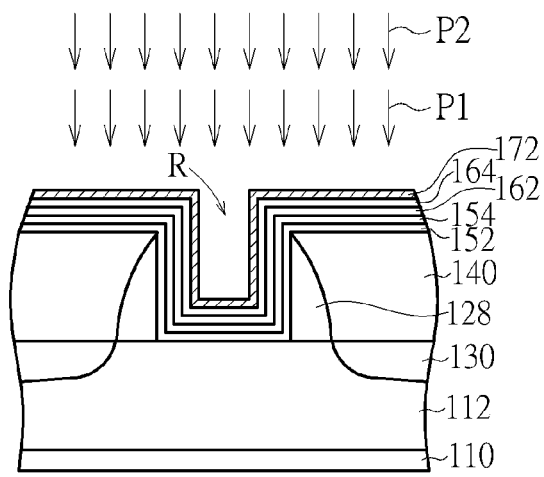

As shown in FIG. 6, a first metal layer 172 is formed to conformally cover the work function metal layer 164. In the present invention, the first metal layer 172 is formed by at least two processing steps. For example, the first metal layer 172 maybe formed by a first step P1 followed by a second step P2, and the processing power of the second step P2 is higher than the processing power of the first step P1. In this case, the first metal layer 172 is formed by a physical vapor deposition (PVD) process, thereby the processing power is a DC/RF(AC). As the processing RF power becomes higher, the bombard energy of sputtering becomes larger. In one preferred case, the processing RF power of the first step P1 is in a range of 0-50 watts while the processing power of the second step P2 is in a range of 200-1000 watts, but it is not limited thereto. Therefore, the first step P1 having a relative lower processing power is applied previously to prevent layers such as the work function metal layer 164 below the first metal layer 172 from damage and to prevent ingredients of the work function metal layer 164 from splashing and polluting the formed first metal layer 172. Thereafter, the second step P2 with a relative higher processing power is applied to get better gap filling and save processing time. Preferably, the thickness deposited in the second step P2 is larger than the thickness deposited in the first step P1. Still preferably, the ratio of the thickness deposited in the second step P2 and the thickness deposited in the first step P1 is in a range of 1-2 for achieving said purposes efficiently. By applying the first step P1 paired with the second step P2, better threshold voltage uniformity of adjacent formed devices can thus approach. In this case, the first metal layer 172 is a titanium nitride layer serving as a barrier layer, and then a second metal layer is later formed, but it is not limited thereto. In other cases, the first metal layer 172 may be a titanium layer, or others. Besides, the first metal layer 172 is a single layer in this case, but the first metal layer 172 may be a multilayer additionally.

Figure 7:
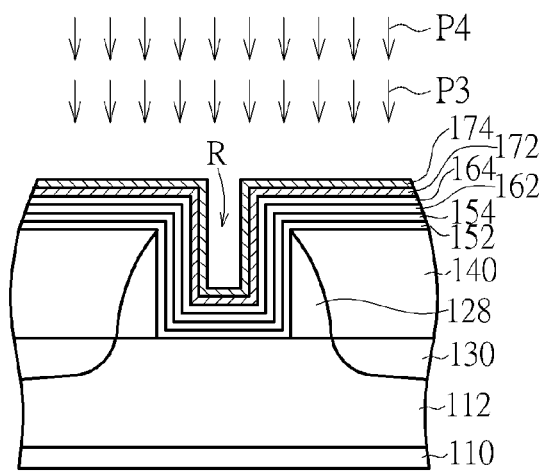

As shown in FIG. 7, a second metal layer 174 is formed to cover the first metal layer 172. In this embodiment, the second metal layer 174 directly contacts the first metal layer 172, and hence the second metal layer 174 and the first metal layer 172 constitute a top barrier layer. More precisely, the first metal layer 172 serves as a barrier layer while the second metal layer 174 serves as a wetting layer. Therefore, the second metal layer 174 is preferably a titanium layer while the first metal layer 172 is a titanium nitride layer.

In a preferred embodiment, the second metal layer 174 is also formed by at least two processing steps. For instance, the second metal layer 174 may be formed by a third step P3 followed by a fourth step P4, and the processing power of the fourth step P4 is higher than the processing power of the third step P3. In this case, the second metal layer 174 is also formed by a physical vapor deposition (PVD) process, thereby the processing power is a DC/RF (AC) power. As the processing RF power becomes higher, the bombard energy of sputtering becomes larger. In one preferred case, the processing RF power of the third step P3 is in a range of 0-550 watts while the processing power of the fourth step P4 is in a range of 700-1000 watts, but it is not limited thereto.

Therefore, the third step P3 having a relative lower processing power is applied previously to prevent layers such as the first metal layer 172 below the second metal layer 174 from damage and to prevent ingredients of the first metal layer 172 from splashing and polluting the formed second metal layer 174. Thereafter, the fourth step P4 with a relative higher processing power is applied to get better gap filling and save processing time. Preferably, the thickness deposited in the fourth step P4 is larger than the thickness deposited in the third step P3. Still preferably, the ratio of the thickness deposited in the fourth step P4 and the thickness deposited in the third step P3 is in a range of 1-2 for achieving said purposes efficiently. By applying the third step P3 paired with the fourth step P4, better threshold voltage uniformity of adjacent formed devices can thus approach.

It is emphasized that, although the first metal layer 172 and the second metal layer 174 are both formed by physical vapor deposition (PVD) processes, the first metal layer 172 and the second metal layer 174 are preferably formed by different processing chambers to get pure titanium nitride layer and pure titanium layer. Hence, films of the first metal layer 172 and the second metal layer 174 can have uniform properties. In this embodiment, the first metal layer 172 and the second metal layer 174 are applied, but there may be only one single metal layer or more than two metal layers being formed by the processes of the present invention. This means every metal layer may be formed by at least two processing steps, and a later processing step has a higher processing power than a processing power of a former processing step.

Above all, the first metal layer 172 maybe formed by only two steps of the first step P1 and the second step P2, and the second metal layer 174 may be formed by only two steps of the third step P3 and the fourth step P4, but the present invention is not restricted thereto. The first metal layer 172 and the second metal layer 174 may be formed by several steps. In a preferred case, the first metal layer 172 maybe formed by a gradient processing power from the first step P1 to the second step P2. Similarly, the second metal layer 174 may be formed by a gradient processing power from the third step P3 to the fourth step P4. Furthermore, the gradient processing powers increase from the first step P1 to the second step P2, or the third step P3 to the fourth step P4.

Figure 8:
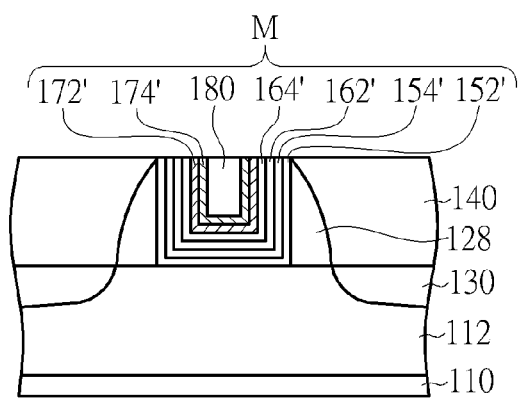

A metal material (not shown) fills the recess R and then the metal material, the second metal layer 174, the first metal layer 172, the work function metal layer 164, the bottom barrier layer 162, the dielectric layer 154 and the optional buffer layer 152 are planarized until the interdielectric layer 140 is exposed, thereby an optional buffer layer 152', a dielectric layer 154', a bottom barrier layer 162', a work function metal layer 164', a first metal layer 172', a second metal layer 174' and a metal material 180 being formed, as shown in FIG. 8. These layers constitute a metal gate M. The metal material 180 may be composed of aluminum, or others. Since agate last for high-k last process is applied, these layers including the optional buffer layer 152', the dielectric layer 154', the bottom barrier layer 162', the work function metal layer 164', the first metal layer 172' the second metal layer 174' have U-shaped cross-sectional profiles, but the present invention is not restricted thereto.

To summarize, the present invention provides a metal gate forming process, which forms a first metal layer on a substrate and then optionally forms a second metal layer on the first metal layer. The first metal layer is formed by processing at least two steps. In one case, a first step is followed by a second step, wherein the processing power of the second step is higher than the processing power of the first step. By doing this, the first step with a relative lower processing power is carried out previously to prevent layers below the first metal layer from damage and to prevent ingredients of the below layers from splashing and polluting the formed first metal layer. Moreover, the second step with a relative higher processing power is carried out to get better gap filling and save processing time. By applying the first step paired with the second step, better threshold voltage uniformity of adjacent formed devices can approach.

Similarly, the second metal layer can be formed by processing at least two steps. In one case, a third step is followed by a fourth step, wherein the processing power of the fourth step is higher than the processing power of the third step, to achieve same purposes of forming the first metal layer.

The first metal layer and the second metal layer may both be formed by physical vapor deposition (PVD) processes with different processing chambers to get pure layers such as a titanium nitride layer of the first metal layer and a titanium layer of the second metal layer for serving the first metal layer as a barrier layer and serving the second metal layer as a wetting layer efficiently.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A metal gate forming process, comprising:
   forming a first metal layer on a substrate by at least a first step followed by a second step, wherein the processing power of the second step is higher than the processing power of the first step; and
   forming a second metal layer on the first metal layer by at least a third step followed by a fourth step, wherein the processing power of the fourth step is higher than the processing power of the third step.

2. The metal gate forming process according to claim 1, wherein the first metal layer comprises a titanium layer or a titanium nitride layer.

3. The metal gate forming process according to claim 1, wherein the first metal layer is formed by a physical vapor deposition (PVD) process.

4. The metal gate forming process according to claim 1, wherein the second metal layer comprises a titanium layer while the first metal layer comprises a titanium nitride layer.

5. The metal gate forming process according to claim 4, wherein the processing power of the first step is in a range of 0-50 watts.

6. The metal gate forming process according to claim 5, wherein the processing power of the second step is in a range of 200-1000 watts.

7. The metal gate forming process according to claim 4, wherein the processing power of the third step is in a range of 0-550 watts.

8. The metal gate forming process according to claim 7, wherein the processing power of the fourth step is in a range of 700-1000 watts.

9. The metal gate forming process according to claim 4, wherein the first metal layer and the second metal layer are formed by physical vapor deposition (PVD) processes.

10. The metal gate forming process according to claim 9, wherein the first metal layer and the second metal layer are formed by different processing chambers.

11. The metal gate forming process according to claim 1, wherein the first metal layer is formed by a gradient processing power from the first step to the second step.

12. The metal gate forming process according to claim 1, further comprising:
    forming a metal material on the first metal layer.

13. The metal gate forming process according to claim 12, wherein the metal material comprises aluminum.

14. The metal gate forming process according to claim 1, further comprising:
   forming a work function metal layer between the first metal layer and the substrate.

15. The metal gate forming process according to claim 14, further comprising:
   forming a bottom barrier layer between the work function metal layer and the substrate.

16. The metal gate forming process according to claim 1, wherein the first metal layer has a U-shaped cross-sectional profile.

* * * * *